United States Patent
Lim et al.

(10) Patent No.: US 7,403,007 B1
(45) Date of Patent: Jul. 22, 2008

(54) NUCLEAR MAGNETIC RESONANCE PROBE WITH COOLED SAMPLE COIL

(75) Inventors: Yit Aun Lim, Boston, MA (US);
Eckhard Bez, Littleton, MA (US);
Xiaozhong Zhang, Hudson, NH (US);
Werner E. Maas, Boxford, MA (US)

(73) Assignee: Broker Bio Spin Corporation, Billerica, MA (US)

( * ) Notice: Subject to any disclaimer, the term of this patent is extended or adjusted under 35 U.S.C. 154(b) by 0 days.

(21) Appl. No.: 11/670,298

(22) Filed: Feb. 1, 2007

(51) Int. Cl.
*G01V 3/00* (2006.01)

(52) U.S. Cl. ............... 324/315; 324/307; 324/309; 324/310; 324/318

(58) Field of Classification Search ......... 324/300–322; 600/410–435; 333/219–235; 343/725–730, 343/741–744, 824, 866–871, 893, 904–906, 343/700 MS
See application file for complete search history.

(56) References Cited

U.S. PATENT DOCUMENTS

| | | | | |
|---|---|---|---|---|
| 2,202,700 A | * | 5/1940 | Leeds | 370/278 |
| 5,493,573 A | * | 2/1996 | Kobayashi et al. | 370/236 |
| 6,231,776 B1 | * | 5/2001 | Flamm | 216/68 |
| 6,307,371 B1 | * | 10/2001 | Zeiger | 324/318 |

* cited by examiner

*Primary Examiner*—Brij B. Shrivastav
*Assistant Examiner*—Dixomara Vargas
(74) *Attorney, Agent, or Firm*—Law Offices of Paul E. Kudirka

(57) ABSTRACT

In a nuclear magnetic resonance probe, the sample coil is connected to the RF excitation source via transmission lines that are arranged to generate one or more nodal points at the $^1$H excitation frequency along their lengths and a balanced magnetic filed profile within the sample coil. Heat exchangers are then connected directly to the inner conductor of the transmission line at these nodal points. The transmission line inner conductors are in direct contact with the sample coil and efficiently cool the coil to cryogenic temperatures without interfering with the $^1$H resonance or RF profile.

20 Claims, 4 Drawing Sheets

NUCLEAR MAGNETIC RESONANCE PROBE WITH COOLED SAMPLE COIL

BACKGROUND

This invention relates to nuclear magnetic resonance probes with sample coils that are cooled by means of cryogenic materials. In conventional nuclear magnetic resonance spectroscopy apparatus, a sample to be analyzed is positioned within a static magnetic field produced within the bore of a high field strength magnet. A probe for detecting magnetic fields is positioned around the sample. The probe includes radio frequency transmitter and receiver coils (which may be the same coil) positioned near the sample for both exciting and detecting magnetic moments in the sample material. Typically, the sample coil is made of copper or other ordinary conductive materials and is arranged to be resonant at the applicable frequencies.

In many applications, it is advantageous to cool the sample coil. The advantages include an increased Q (quality factor) in the resonator, which in turn, results in a higher signal-to-noise ratio available from the sample. Further, thermal noise generated by copper sample coils can be reduced by cooling the coils. Reduced thermal noise associated with probe circuit improves sensitivity of the spectrometer. A higher signal-to-noise ratio means shorter experimental times and higher throughput. Another advantage is that the sample itself can be more conveniently cooled to cryogenic temperature for certain types of experiments.

A number of conventional approaches are used to cool the sample coil. One approach is to fabricate the sample coil from a hollow tube instead of a solid wire and to pump a cryogenic cooling fluid through the hollow tube thereby cooling the coil from the inside. This approach has the disadvantage that the production of coils of this type is difficult and the coil geometries that can be attained are limited. In addition, forcing the cryogenic cooling fluid through the tube under pressure may give rise to vibrations that detract from the probe operation.

In another approach, a multi-walled quartz Dewar flask is used. This flask is constructed as an annulus that is surrounded both on the inside and outside by double walls. The space between the double walls is evacuated. The sample coil fits into the annulus which is then filled with cryogenic cooling fluid. The disadvantage here is that the "filling" factor is poor resulting in poor NMR sensitivity. In addition, the Dewar flask design is difficult and costly to implement.

In still another prior art approach, a heat exchanger cools a substrate fabricated from a material with high thermal conductivity, but poor electrical conductivity, such as sapphire. The sample coil is in contact with the cooled substrate and is thereby cooled. A disadvantage here is that the substrate material is typically planar and the sample coil must be deposited onto the substrate for good thermal contact. Thus, the sample coil must also be planar and consequently has limited geometry. In addition, the planar coils typically do not have a power handling capability generally required for solid state NMR experiments. A further disadvantage is that the transfer of heat is inefficient due to multi-material contact.

In another approach, one end of the sample coil is directly in contact with, and cooled by, a cooled platform. However, in this configuration, the magnetic field within sample coil is unbalanced as the cooled platform must be grounded in order not to interfere with the $^1H$ resonance.

SUMMARY

In accordance with the principles of the present invention, the RF source is connected to the sample coil via transmission lines. These transmission lines are arranged to generate one or more nodal points at the $^1H$ frequency. Heat exchangers are then connected directly to the inner conductor of the transmission line at these nodal points. The transmission line inner conductors are in direct contact with the sample coil and efficiently cool the coil to cryogenic temperatures without interfering with the $^1H$ resonance or profile.

In one embodiment, both ends of the sample coil are connected to the inner conductors of transmission lines. The other ends of both inner conductors are terminated on a cooled plate that is grounded. The transmission line lengths are adjusted so that the cooled plate is at a nodal point at the $^1H$ frequency for both lines. The sample coil is driven by coupling the driving energy, either inductively or capacitively, to the inner conductor of one of the transmission lines.

In another embodiment, the transmission lines connected between the sample coil and the cooled plate are extended while maintaining the plate at a nodal point so that the plate can be placed outside of the probe structure and the magnet bore. This embodiment allows for a larger, more powerful heat exchanger to cool the plate.

In still another embodiment, both ends of the sample coil are again connected to the inner conductors of transmission lines. The other end of an inner conductor for one transmission line is terminated on a cooled plate that is grounded. The length of this transmission line is adjusted so that the cooled plate is at a nodal point at the $^1H$ frequency. The other end of the second transmission line is open ended and its length is adjusted so that it supports a half wavelength standing wave at the $^1H$ frequency with a nodal point halfway along its length. The sample coil is driven by coupling the driving energy either inductively or capacitively to the inner conductor of one of the transmission lines. This embodiment has the advantage that a second frequency can be introduced at the latter nodal point without interfering with the $^1H$ frequency balance and resonance.

In yet another embodiment, the cooled plate is replaced with a cylindrical heat exchanger that fits into the outer conductor of the transmission line.

DETAILED DESCRIPTION

Figure 1:
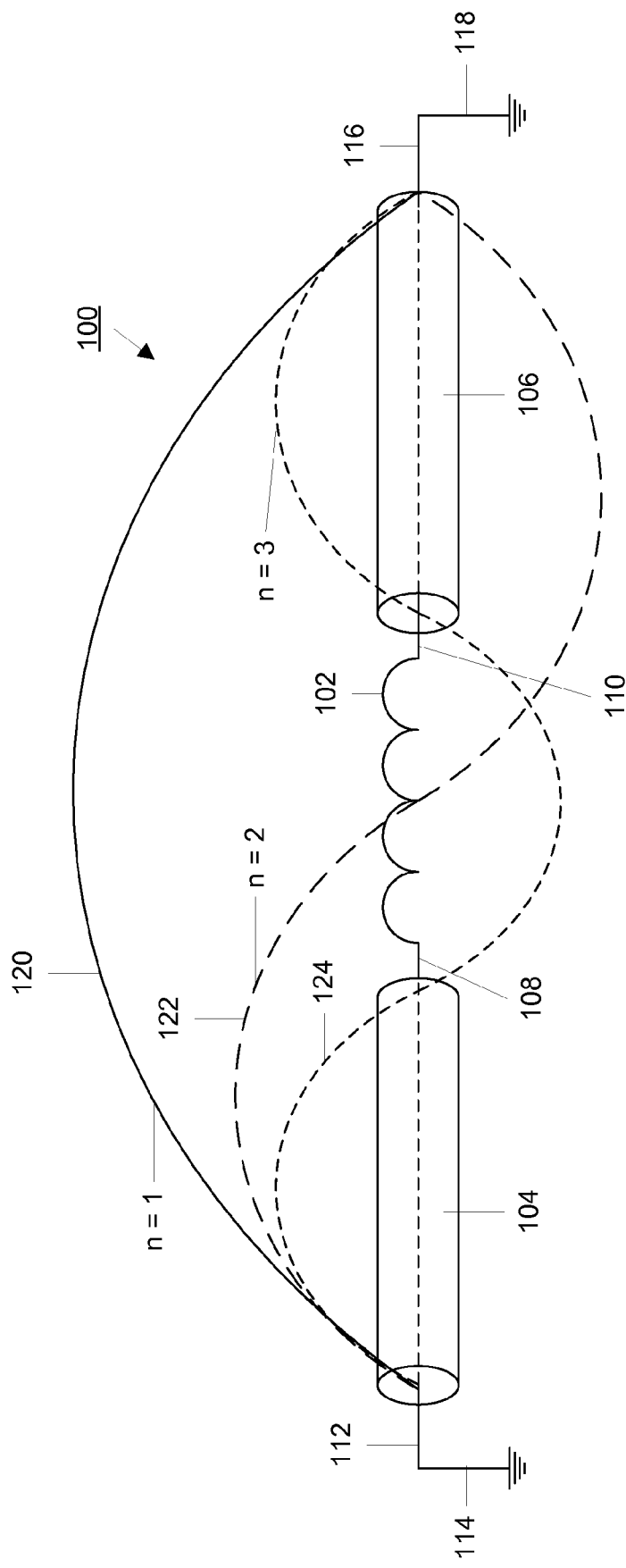
FIG. 1 is a schematic diagram of a sample coil cascaded between two transmission lines that illustrates some of the different resonances that the cascaded structure can support.

FIG. 1 illustrates one embodiment 100 of the invention in which a sample coil 102 is connected to the inner conductors 108 and 110 of two transmission lines 104 and 106. The other ends, 112 and 116, of the inner conductors of the transmission lines 104 and 106 are grounded to a common ground plate as indicated schematically by grounds 114 and 118, respectively. This structure can then be driven by radio frequency energy by coupling the energy into the resonant structure 100 either capacitive or inductively. The cascaded structure 100 will be resonant at many different frequencies of the driving energy and standing waves can be supported within the structure 100. The standing waves at three different driving frequencies are shown schematically in FIG. 1 by the dotted lines 120, 122 and 124 which represent voltage values within the structure 100.

At the lowest resonant frequency (n=1), the standing wave voltage 120 will have a single maximum at the center of the sample coil 102 and a minimum at the ground points 112 and 116. At the next lowest resonant frequency (n=2), the standing wave 122 has voltage maxima of opposite phases, which occur at the two ends 108 and 110 of the sample coil 102, while a voltage null occurs at the center of the sample coil 102. At the next lowest resonant frequency (n=3) the standing wave 124 has three voltage maxima, which occur somewhere along the transmission lines 104 and 106 and at the center of the sample coil 102. By selecting an appropriate driving frequency, for example n=2, a voltage null will occur at the center of the sample coil 102. As a result, that driving frequency will produce a symmetrical and balanced magnetic field at the center of the sample coil, as desired.

Figure 2A:
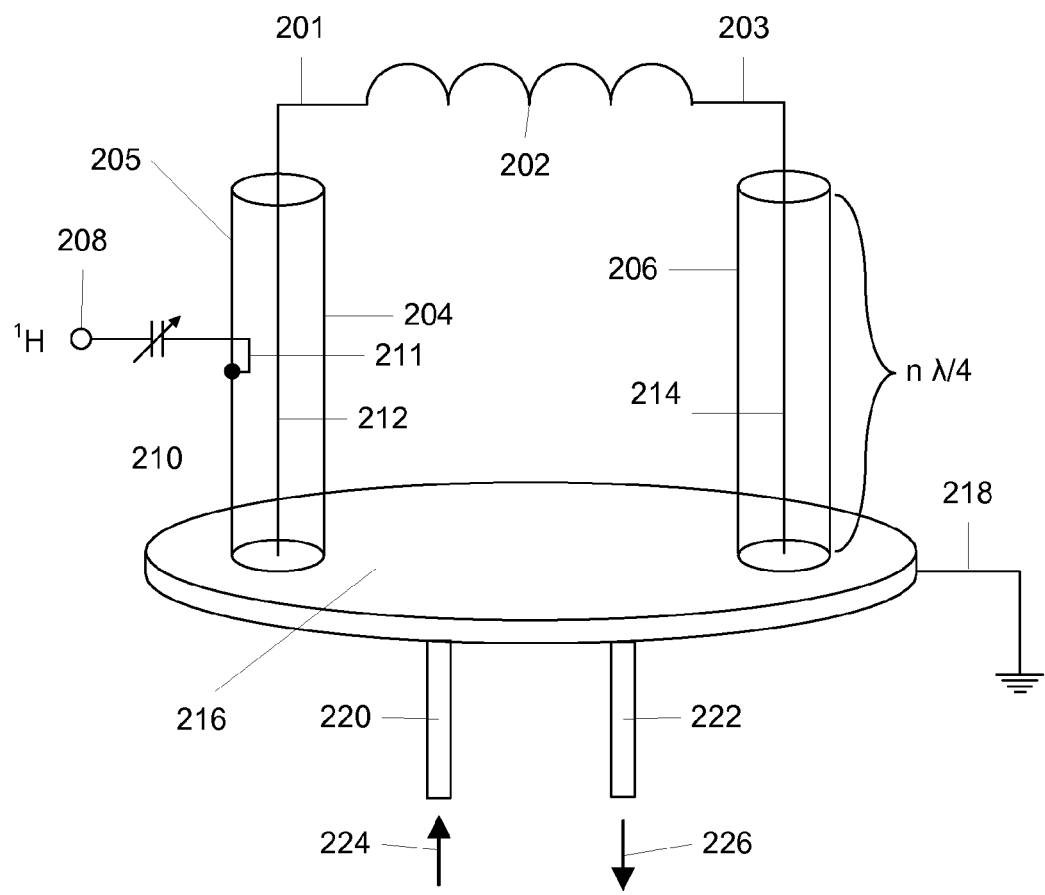
FIG. 2A is a schematic diagram that shows the cascaded structure connected to a cooled plate with RF energy at a first resonant frequency applied to the structure via inductive coupling.

FIG. 2A shows a cascaded structure, such as that shown in FIG. 1, attached to a cooled ground plate 216 in order to cool the sample coil 202. In this structure, sample coil 202 with terminals 201 and 203 is connected to the inner conductors 212 and 214 of two transmission lines 204 and 206, respectively. The inner conductors 212 and 214 of the transmission lines 204 and 206 are connected to the common plate 216 which is grounded as indicated at 218. Plate 216 may illustratively be hollow so that a cooling fluid can circulate through the plate and cool it. The cooling fluid enters the plate 216 via inlet pipe 220 as indicated by arrow 224 and exits the plate 216 via outlet pipe 222 as indicated schematically by arrow 226. As illustrated, this structure is driven with radio frequency energy at the $^1$H frequency applied to terminal 208 and inductively coupled to the inner conductor 212 of transmission line 204 via the small section 211 that extends parallel to the inner conductor 212. Adjustable capacitor 210 matches the impedance of the resonant structure as seen by terminal 208 for efficient RF energy transfer. The lengths of transmission lines 204 and 206 are chosen to be an odd multiple of one quarter of the driving energy wavelength (n $\lambda_H/4$, where n=1, 3, 5, etc.) Alternatively, the structure can driven with radio frequency energy at the $^1$H frequency applied to terminal 208 and capacitively coupled to the inner conductor 212 of transmission line 204 as shown in the partial schematic view of FIG. 2B.

Figure 2B:
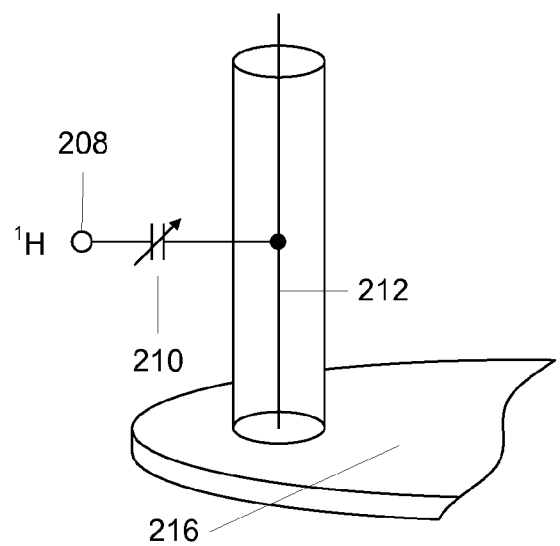
FIG. 2B is a partial schematic diagram that shows the cascaded structure connected to a cooled plate with RF energy at a first resonant frequency applied to the structure via capacitive coupling.

In the structure shown in FIGS. 2A and 2B, the cooled ground plate 216 can effectively cool the sample coil 202 down to cryogenic temperatures. Since the sample coil 202 and the inner conductors 212 and 214 of transmission lines 204 and 206 are in direct contact with the grounded and cooled platform 216, the transfer of heat between the sample coil 202 and the plate 216 is very efficient. Although fluid cooling is shown in FIGS. 2A and 2B for purposes of illustration, the method for cooling the cold plate is not restricted in this structure since the plate 216 is always at ground potential and thus has no effect on the electrical length of the transmission lines 204 and 206 or resonant frequency.

Because the transmission lines 204 and 206 can be extended in length by odd multiples of $\lambda_H/4$, the cooled plate 216 can be placed outside the probe structure and magnet bore (not shown in FIGS. 2A and 2B) to allow a larger, more powerful heat exchanger to be used to cool the plate 216.

Figure 3:
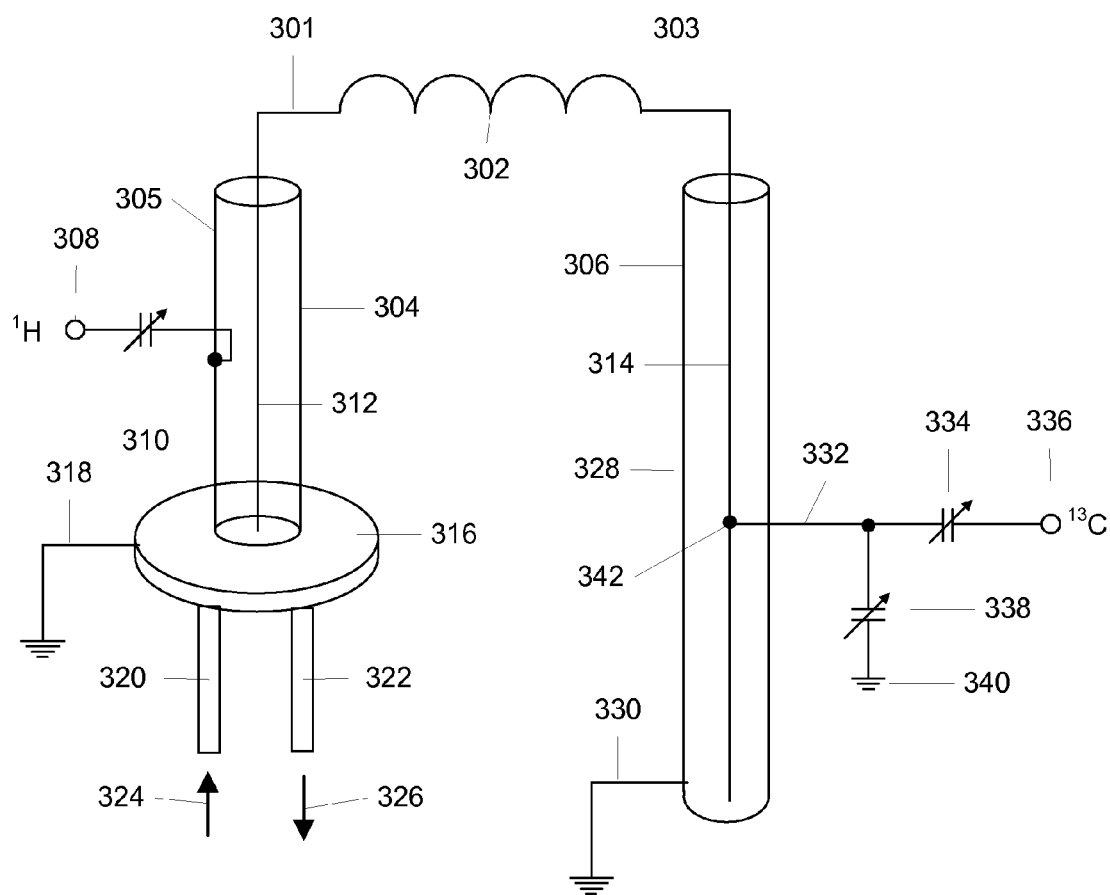
FIG. 3 is a schematic diagram of a cascaded structure in which one leg has been extended to allow an additional resonant frequency to be applied to the structure without disturbing the resonance of the structure at the first resonant frequency.

In another embodiment of the invention illustrated in FIG. 3, a modified structure allows the introduction of another driving frequency. In this structure, sample coil 302 with terminals 301 and 303 is connected to the inner conductors 312 and 314 of two transmission lines 304 and 306, respectively. The inner conductor 312 of the transmission line 304 is connected to a cooled plate 316 which is grounded as indicated at 318. Plate 316 may illustratively be hollow so that a cooling fluid can circulate through the plate and cool it. The cooling fluid enters the plate 316 via inlet pipe 320 as indicated by arrow 324 and exits the plate 316 via outlet pipe 322 as indicated schematically by arrow 326. As illustrated, this structure is driven with radio frequency energy at the $^1$H frequency applied to terminal 308 and inductively coupled to the inner conductor 312 of transmission line 304. Adjustable capacitor 310 matches the impedance of the resonant structure as seen by terminal 308 for efficient RF energy transfer. The length of transmission line 304 is chosen to be an odd multiple of one quarter of the driving energy wavelength (n $\lambda_H/4$, where n=1, 3, 5, etc.). Alternatively, the structure can driven with radio frequency energy at the $^1$H frequency applied to terminal 308 and capacitively coupled to the inner conductor 312 of transmission line 304 along the lines of the structure illustrated in FIG. 2B.

Transmission line 306 is extended to a length of $\lambda_H/2$ and is open-ended. The outer conductor 328 is grounded as indicated at 330. As extended, transmission line 306 supports a half wavelength standing wave for $^1$H frequency with a voltage null halfway along its length. Voltage maxima of opposite phases still occur on both ends of the sample coil 302 and, thus, the structure remains balanced at the $^1$H frequency.

The voltage null at the center of transmission line 306 allows RF energy with a second resonant frequency, such as the $^{13}$C frequency, to be coupled into the structure without any effect on the $^1$H resonance. For example, RF energy at the $^{13}$C frequency at terminal 336 can be coupled to the nodal point 342 on the inner conductor 314 of transmission line 306 by means of adjustable capacitor 334. Adjustable capacitor 338 adjusts the frequency of the resonant structure to the $^{13}$C frequency as seen by terminal 336. As nodal point 342 is at ground potential at the $^1$H frequency, adjustment of adjustable capacitor 338 has no impact on the $^1$H resonance.

Additional RF energy at other resonance frequencies, such as the $^{15}$N resonance, can be added to the structure either through the same nodal point 342 that the $^{13}$C resonant frequency is added, or by extending the open-ended transmission line 306 by another $\lambda_H/2$ length to generate another voltage null at the $^1$H frequency farther along the line 306 and then coupling the additional RF energy to the structure at the position of the second voltage null. Either method has no impact on $^1$H balance or frequency as additions are made at voltage nulls of the $^1$H frequency.

Figure 4:
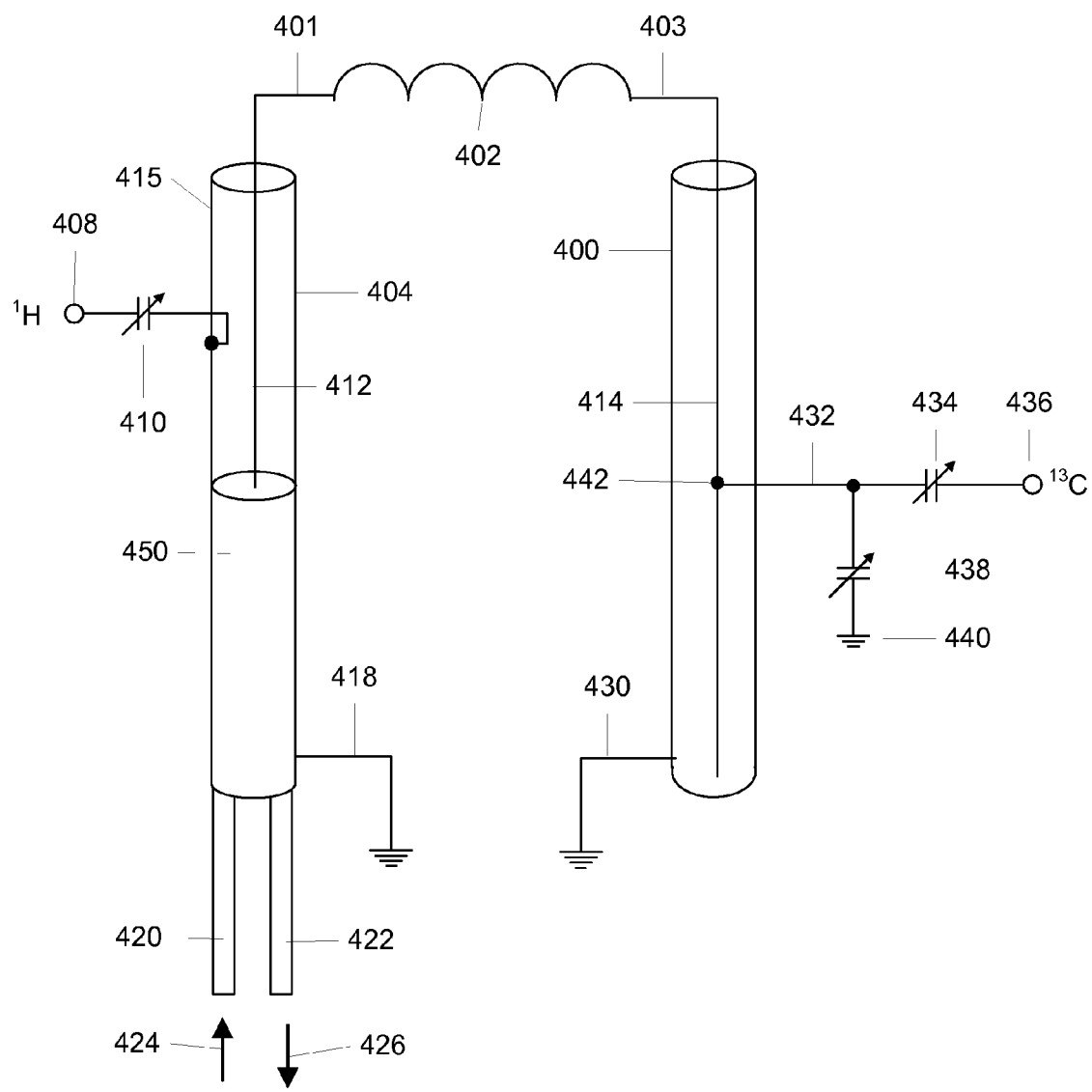
FIG. 4 is a schematic diagram showing another embodiment in which the cooled plate has been replaced by a cylindrical heat exchanger.

In this embodiment, one terminal 301 of the sample coil 302 is connected directly to the inner conductor 312 of one of the transmission lines 304, which, in turn, is in direct contact with the grounded cold platform 316; hence the transfer of heat between the sample coil 302 and the cold platform 316 will also be very efficient. FIG. 4 shows another embodiment which uses a cylindrical "cold-finger" heat exchanger. Elements in FIG. 4 that correspond to elements in FIG. 3 have been given corresponding numeral designations. For example, sample coil 402 in FIG. 4 corresponds to sample coil 302 in FIG. 3. To shorten the description, elements in FIG. 4 that correspond to elements in FIG. 3 will not be described further herein. In the FIG. 4 embodiment, the outer conductor 415 of transmission line 404 has been extended and a cylindrical heat exchanger 450 is placed within the extended outer conductor 415. The heat exchanger 450 is connected directly to the inner conductor 412 of transmission line 404 in order to cool sample coil 402. This compact and efficient cooling arrangement can be implemented in standard bore probes where use of components with large radial dimensions are limited.

The present invention does not require special materials or construction for the sample coil. Since the sample coil is cooled via direct contact at its terminals rather than through sapphire substrates on the surface of the coil or surrounded by dewars for cryogenic fluids, this method can be used in areas where space is severely restricted, such as within the probe body of a Magic Angle Spinning (MAS) system. Use of transmission lines also provides greater power handling typically required by solid state NMR experiments, a requirement that is particularly challenging at high fields.

While the invention has been shown and described with reference to a number of embodiments thereof, it will be recognized by those skilled in the art that various changes in form and detail may be made herein without departing from the spirit and scope of the invention as defined by the appended claims.

What is claimed is:

1. A nuclear magnetic resonance probe having a cooled sample coil excited by energy having an excitation frequency generated by a source, the probe comprising:
   a transmission line having an inner conductor connected to the sample coil, wherein the transmission line is arranged to produce a nodal point at the excitation frequency along a length of the inner conductor; and
   a heat exchanger brought into direct thermal contact with the inner conductor of the transmission line at the nodal point to cool the sample coil.

2. The nuclear magnetic resonance probe of claim 1 wherein the sample coil has two terminals and wherein the probe comprises two transmission lines, each transmission line having an inner conductor connected to one terminal of the sample coil, wherein each transmission line is arranged to generate a nodal point at the excitation frequency along a length of its inner conductor and wherein the heat exchanger is brought into direct thermal contact with the inner conductors of both of the transmission lines at the nodal points.

3. The nuclear magnetic resonance probe of claim 1 wherein the excitation energy has a wavelength and wherein both the transmission line and the inner conductor have a length substantially equal to one quarter of the wavelength so that the nodal point occurs at an end of the inner conductor that is not connected to the sample coil.

4. The nuclear magnetic resonance probe of claim 1 wherein the transmission line has an inner conductor electrically coupled to the source.

5. The nuclear magnetic resonance probe of claim 4 wherein the inner conductor is coupled by means of a capacitive coupling to the source.

6. The nuclear magnetic resonance probe of claim 4 wherein the inner conductor is coupled by means of an inductive coupling to the source.

7. The nuclear magnetic resonance probe of claim 1 wherein the probe further comprises another transmission line having another inner conductor connected to the sample coil, wherein the other transmission line is arranged to produce another nodal point at the excitation frequency along a length of the other inner conductor and wherein the probe further comprises means for coupling the other nodal point to another excitation source having a frequency different from the excitation source.

8. The nuclear magnetic resonance probe of claim 7 wherein the excitation energy has a wavelength and wherein the other transmission line and the other inner conductor have a length substantially equal to one half the wavelength.

9. The nuclear magnetic resonance probe of claim 1 wherein the heat exchanger is electrically grounded with respect to the source.

10. The nuclear magnetic resonance probe of claim 1 wherein the heat exchanger is a flat hollow plate through which cooling fluid is circulated.

11. The nuclear magnetic resonance probe of claim 1 wherein the transmission line has a cylindrical outer conductor and wherein the heat exchanger is cylindrical and shaped to fit inside of the transmission line outer conductor.

12. Apparatus for cooling with a heat exchanger, a nuclear magnetic resonance probe sample coil that is excited by energy having an excitation frequency generated by a source, the apparatus comprising:
   a transmission line having an inner conductor connected to the sample coil, wherein the transmission line is arranged to produce a nodal point at the excitation frequency along a length of the inner conductor; and
   cooling means for bringing the heat exchanger into direct thermal contact with the inner conductor of the transmission line at the nodal point to cool the sample coil.

13. The apparatus of claim 12 wherein the sample coil has two terminals and wherein the apparatus comprises two transmission lines, each transmission line having an inner conductor connected to one terminal of the sample coil, wherein each transmission line is arranged to generate a nodal point at the excitation frequency along a length of its inner conductor and wherein the cooling means brings the heat exchanger into direct thermal contact with the inner conductors of both of the transmission lines at the nodal points.

14. The apparatus of claim 12 wherein the excitation energy has a wavelength and wherein both the transmission line and the inner conductor have a length substantially equal to one quarter of the wavelength so that the nodal point occurs at an end of the inner conductor that is not connected to the sample coil.

15. The apparatus of claim 12 wherein the transmission line has an inner conductor electrically coupled to the source.

16. The apparatus of claim 1 wherein the inner conductor is coupled by means of a capacitive coupling to the source.

17. The apparatus of claim 16 wherein the inner conductor is coupled by means of an inductive coupling to the source.

18. The apparatus of claim 12 wherein the probe further comprises another transmission line having another inner conductor connected to the sample coil, wherein the other transmission line is arranged to generate another nodal point at the excitation frequency along a length of the other inner conductor and wherein the probe further comprises means for coupling the other nodal point to another excitation source having a frequency different from the excitation source.

19. The apparatus of claim 18 wherein the excitation energy has a wavelength and wherein the other transmission line and the other inner conductor have a length substantially equal to one half the wavelength.

20. A method for cooling with a heat exchanger, a nuclear magnetic resonance probe sample coil that is excited by energy having an excitation frequency generated by a source, the method comprising:

(a) connecting an inner conductor of a transmission line to the sample coil;
(b) adjusting the length of the transmission line to produce a nodal point at the excitation frequency along a length of the inner conductor; and
(c) bringing the heat exchanger into direct thermal contact with the inner conductor of the transmission line at the nodal point to cool the sample coil.

* * * * *

UNITED STATES PATENT AND TRADEMARK OFFICE
CERTIFICATE OF CORRECTION

PATENT NO. : 7,403,007 B1 Page 1 of 1
APPLICATION NO. : 11/670298
DATED : July 22, 2008
INVENTOR(S) : Yit Aun Lim et al.

It is certified that error appears in the above-identified patent and that said Letters Patent is hereby corrected as shown below:

Column 6,
Line 55, please replace "claim 1" with --claim 15--

Signed and Sealed this

Twenty-third Day of December, 2008

JON W. DUDAS
*Director of the United States Patent and Trademark Office*